United States Patent
Nandi

(10) Patent No.: US 10,340,941 B1
(45) Date of Patent: Jul. 2, 2019

(54) TRIM DIGITAL-TO-ANALOG CONVERTER (DAC) FOR AN R2R LADDER DAC

(71) Applicant: TEXAS INSTRUMENTS INCORPORATED, Dallas, TX (US)

(72) Inventor: Gautam Salil Nandi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/183,522

(22) Filed: Nov. 7, 2018

(51) Int. Cl.
*H03M 1/00* (2006.01)
*H03M 1/78* (2006.01)
*H03M 1/12* (2006.01)

(52) U.S. Cl.
CPC ............. *H03M 1/785* (2013.01); *H03M 1/00* (2013.01); *H03M 1/12* (2013.01)

(58) Field of Classification Search
CPC ........... H03M 1/785; H03M 1/00; H03M 1/12
USPC .................................. 341/154, 144
See application file for complete search history.

(56) References Cited

U.S. PATENT DOCUMENTS 6,307,490 B1 * 10/2001 Litfin .................. H03M 1/1033
341/121
6,331,830 B1 * 12/2001 Song ................... H03M 1/1057
341/118
7,095,347 B2 * 8/2006 Hirata ....................... G05F 3/22
341/144

OTHER PUBLICATIONS

McLachlan, Roddy C. et al. "A 20b Clockless DAC With Sub-ppm INL, 7.5 nV/Hz Noise and 0.05 ppm/C Stability." IEEE Journal of Solid-State Circuits. vol. 48, No. 12, Dec. 2013, pp. 3028-3037.

* cited by examiner

Primary Examiner — Brian K Young
(74) Attorney, Agent, or Firm — John R. Pessetto; Charles A. Brill; Frank D. Cimino

(57) ABSTRACT

A digital-to-analog converter (DAC) includes a first stage comprising a plurality of first circuit arms coupled together, each first circuit arm including a resistor. A second stage includes a plurality of second circuit arms coupled together, each second circuit arm comprising a first resistor and a pair of series-connected resistors. The first resistors of the second circuit arms are connected in series. A current digital-to-analog converter (IDAC) trim circuit is connected to a plurality, but not all, of the second circuit arms of the second stage. The IDAC trim circuit includes a plurality of first current sources. Each first current source is coupled to a respective node between a pair of the series-connected resistors of a corresponding second circuit arm, and each of the first current sources is configured to produce a same current level as the other first current sources.

20 Claims, 3 Drawing Sheets

TRIM DIGITAL-TO-ANALOG CONVERTER (DAC) FOR AN R2R LADDER DAC

BACKGROUND

A digital-to-analog converter (DAC) generates an analog signal based on a digital input value. The "precision" of a DAC refers to the number of bits of the digital input value that the DAC converts to an analog output signal. A 20-bit DAC has a higher precision than a 12-bit DAC. The voltage range of the analog output signal of a DAC is also a design consideration. DACs are available in a variety of configurations and are used in a variety of applications. DACs typically use a reference voltage. The amount of headroom in a DAC refers to the voltage difference between the highest voltage the DAC is capable of producing on its analog output and the lowest power supply voltage level that is required for the desired precision. The headroom can also be expressed as the difference between the highest reference voltage level and the lowest power supply voltage level. Some applications benefit from higher precision DACs (e.g., a 20-bit DAC versus a 12-bit DAC), DACs that are capable of generating a higher range of output voltages (e.g., up to 30 volts versus 5 volts), and DACs that have a smaller headroom (e.g., 1V versus 1.5V).

SUMMARY

A digital-to-analog converter (DAC) includes a first stage comprising a plurality of first circuit arms coupled together, each first circuit arm including a resistor. A second stage includes a plurality of second circuit arms coupled together, each second circuit arm comprising a first resistor and a pair of series-connected resistors. The first resistors of the second circuit arms are connected in series. A current digital-to-analog converter (IDAC) trim circuit is connected to a plurality, but not all, of the second circuit arms of the second stage. The IDAC trim circuit includes a plurality of first current sources. Each first current source is coupled to a respective node between a pair of the series-connected resistors of a corresponding second circuit arm, and each of the first current sources is configured to produce a same current level as the other first current sources.

BRIEF DESCRIPTION OF THE DRAWINGS

For a detailed description of various examples, reference will now be made to the accompanying drawings in which.

DETAILED DESCRIPTION

The DAC described herein includes a first stage including multiple thermometric circuit arms coupled together and a second stage comprising multiple second circuit arms. Each of the first circuit arms comprises one or more resistors. Each of the second circuit arms comprises a first resistor and a pair of series-connected resistors. The first resistors of the second circuit arms are connected in series. The combination of the second circuit arms forms an "R2R" ladder. Each of the first and second circuit arms can receive one of two reference voltages. The selection of which reference voltage is provided to each circuit arm depends on the individual bits of the digital code to be converted to an analog voltage.

The DAC also includes a current DAC (IDAC) trim circuit. In the disclosed example, the IDAC is connected to some, but not all, of the second circuit arms of the second stage to selectively inject current into the respective second circuit arm based on a digital current code (ICODE). The IDAC trim circuit comprises a plurality of first current sources and a plurality of second current sources. Each first current source is coupled, through a switch, to a respective node between a pair of the series-connected resistors of a corresponding second circuit arm. Each of the first current sources is configured to produce the same current level as the other first current sources. Each switch is turned on and off based on a separate bit of the ICODE. For each first current source connected to a node between a pair of series-connected resistors, a second current source is also connected to the same node. Thus, some nodes of series-connected resistors in the second circuit arms are connected to a pair of first and second current sources, and other nodes are not connected to either a first or a second current source. The particular second circuit arms to be connected to pairs of first and second current sources can be determined based on one or more of the following factors: the magnitude of the reference voltages, the precision of the DAC, the desired voltage headroom, the number of first circuit arms, and the step size. The step size is the smallest voltage step at the DAC's output when the least significant bit of the IDAC toggles. The IDAC is used to trim the R2R DAC's differential non-linearities (DNLs), which primarily arise due to mismatches in the unit resistors. DNL refers to the deviation between analog values that correspond to adjacent input digital values. The step size is the desired resolution to effectively trim the DNLs.

Figure 1:
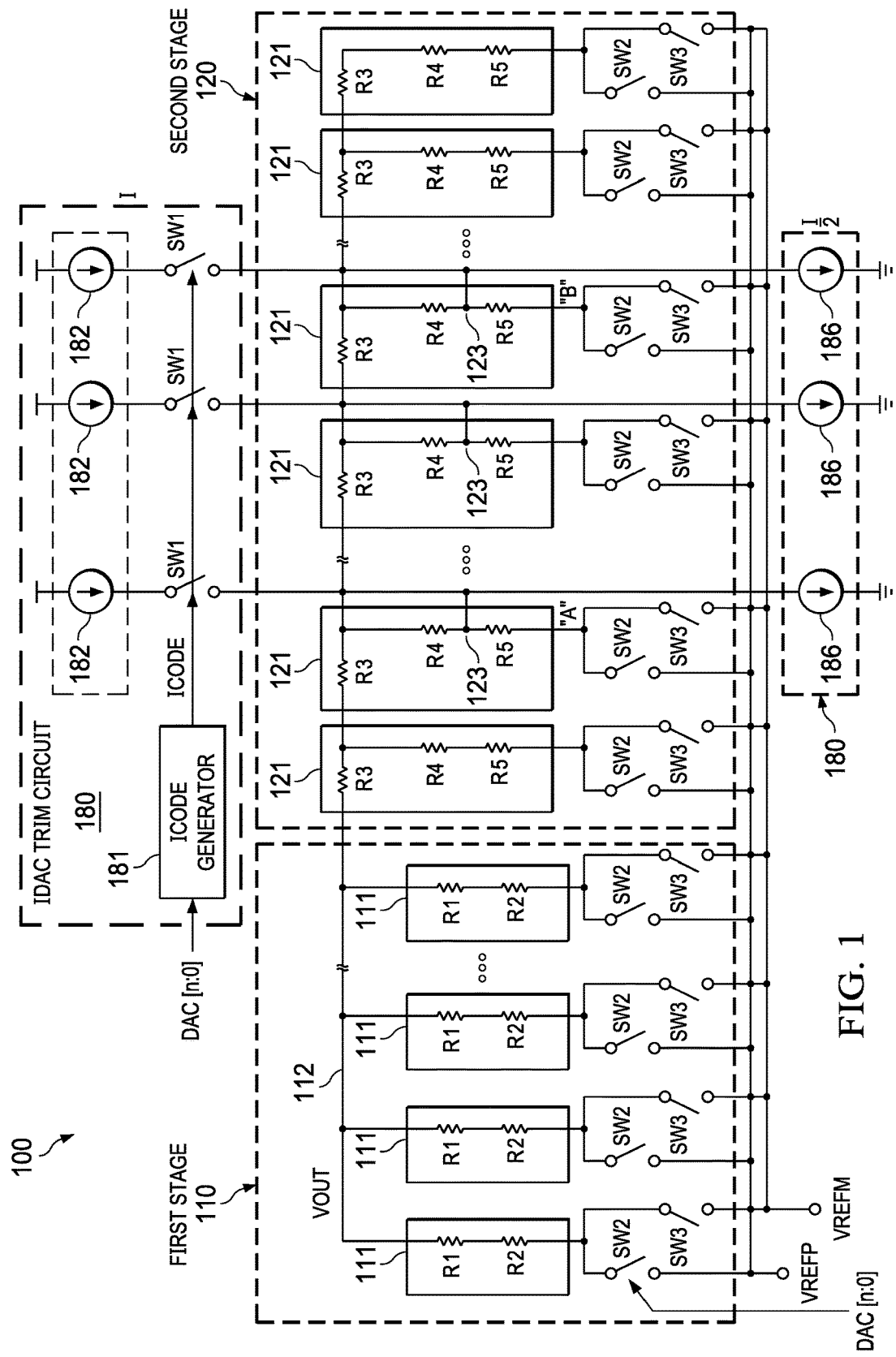
FIG. 1 illustrates a DAC comprising a current DAC trim circuit.

FIG. 1 shows an example of a DAC 100 comprising a first stage 110, a second stage 120, and an IDAC trim circuit 180. The first stage 110 comprises a plurality of circuit arms 111 coupled together at a node 112 which provides the analog output voltage (VOUT) from the DAC 110. Each of the first stage circuit arms 111 includes at least one resistor. In the example of FIG. 1, each circuit arm 111 includes first and second series-connected resistors R1 and R2. The second stage 120 includes a plurality of circuit arms 121 coupled together. Each second stage circuit arm 121 includes a resistor R3 coupled to a pair of series-connected resistors R4 and R5. In some implementations, resistors R1-R5 nominally have the same resistance.

The IDAC trim circuit 180 includes an ICODE generator 181, a plurality of current source devices 182 and a separate switch SW1 coupled to each current source device 182. The current magnitude produced by each of the current source devices 182 is the same. Each switch SW1 couples a corresponding current source device 182 to a node 123 between the series-connected resistors R4 and R5 of some, but not all, of the second stage circuit arms 121. The ICODE generator 181 receives the n-bit digital code (DAC(n:0)) to be converted to an analog signal as an input and generates an ICODE output as a set of control lines. Each control line opens or closes a corresponding switch SW1. When a given switch SW1 is closed, the current from the corresponding current source device 182 flows into the node 123 of the corresponding circuit arm 121. When the given switch SW1 is open, current from the current source device 182 does not flow into the node 123 of the corresponding circuit arm 121.

The IDAC 180 also includes another set of current source devices 186. For each current source device 182, there is a corresponding current source device 186. Each current source device 186 connects to the node 123 to which its counterpart current source device 182 (via switch SW1) connects. In this example, current source devices 186 are connected to the nodes 123 without the use of switches. Current source devices 182 inject current into nodes 123 and current source devices 186 sink current from the nodes 123. The magnitude of the current through the current source devices 186 is the same and is one-half of the current through current sources 182.

Referring still to FIG. 1, a pair of switches SW2 and SW3 is connected together and to each of the circuit arms 111 of the first stage 110 and to each of the circuit arms 121 of the second stage 120. Switches SW2 are coupled to a first reference voltage node designated as VREFP. Switches SW3 are coupled to a second reference voltage node designated as VREFM. VREFP is a higher voltage than VREFM. The digital code to be converted to the analog output voltage VOUT controls the state of switches SW2 and SW3. A binary-to-thermometric decoder may be included to convert the M most significant bits of the DAC[n:0] code to control signals to control switches SW2 and SW3 of the first stage 110. One, but not both, of switches SW2 and SW3 are closed at any point in time. When SW2 is closed for a given circuit arm, VREFP is provided to that circuit arm and when SW3 is closed, VREFM is provided to that circuit arm. The first stage circuit arms 111 are controlled by the most significant M bits of the digital code as a thermometric code. That is, the M most significant bits (e.g., M=6 bits) are converted to a thermometric code which comprises one asserted bit (e.g., high) based on the binary value of the M most significant bits. Each of the N least significant bits of the digital code is used to control the switches SW2 and SW3 in the second stage 120. That is, one bit of the N least significant bits controls the state of a given pair of switches SW2 and SW3 for the second stage 120. When the bit is high, one of the switches SW2 and SW3 is open and the other is closed, and when the bit is low, the switches are controlled to the opposite states. In one example, the DAC 100 is a 20-bit precision DAC and M is 6 and N is 14.

As noted above, the current sources 182 (via switches SW1) and the current sources 186 are connected to the nodes 123 of some of the circuit arms 121, but not to all of the circuit arms 121. Which circuit arms 121 are connected to the current source devices 182, 186 depends on a number of factors including (a) the desired amount of headroom voltage (V_HR), (b) the magnitude of the reference voltage (e.g., VREF=VREFP−VREFM), (c) the precision (P) of the DAC 100 (e.g., 20 bits), (d) the number (T) of thermometric circuit arms 111 in the first stage 110, and the step size (S). The current source devices 182, 186 are connected to a contiguous set of circuit arms 121 between a first circuit arm A and a second circuit arm B (illustrated in FIG. 1). The relationship between B, V_HR, VREF, P, M, and S is shown in Eq. (1) below:

$$2^{B-1} * \frac{2*VREF}{2^{P+S-M}*3} < V\_HR \quad (1)$$

For example, for a desired headroom voltage V_HR of 1V, VREF of 30V, P equal to 20 bits, M equal to 6 (the number of circuit arms 111 is $2^M-1$), and step size S equal to 3, B will be computed per Eq. (1) to being less than or equal to 13.7. As B should be an integer, B will equal 13. The value A can be calculated as B minus (IDAC_size−1), wherein IDAC_size refers to the number of current source device 182, 186 pairs. In the numeric example above, A is calculated as A=B−(IDAC size−1), which equals 13−(10) for an IDAC_size of 11, or A=3. A being 3 and B being 13 means that current source device 182, 186 pairs are connected to the third through thirteenth circuit arms 121 within the second stage 120 where the first circuit arm 121 corresponds to the most significant bit within the N bits of the least significant bits of the digital code.

Assuming the current through current sources 182 is represented as I, the current through current sources 186 is I/2. Equating the voltage at the DAC output (VOUT) due to the last current source connected to arm B to the step size (S) will give an expression for I as:

$$I = 2^{[B-(P+S-M)]} * \frac{VREF}{R}$$

where R is the resistance of R1, R2, R3, R4, and R5 (all of these resistors have the same resistance in the disclosed embodiment). As such, the larger that B is, the larger is the current produced by the current sources 182, 186 and thus larger current source devices 182, 186 are needed. By relaxing the constraint on the headroom voltage (e.g., permitting V_HR to be larger), the value of B (and A as well) will be calculated to be a smaller value thereby permitting smaller current source devices to be used.

Figure 2:
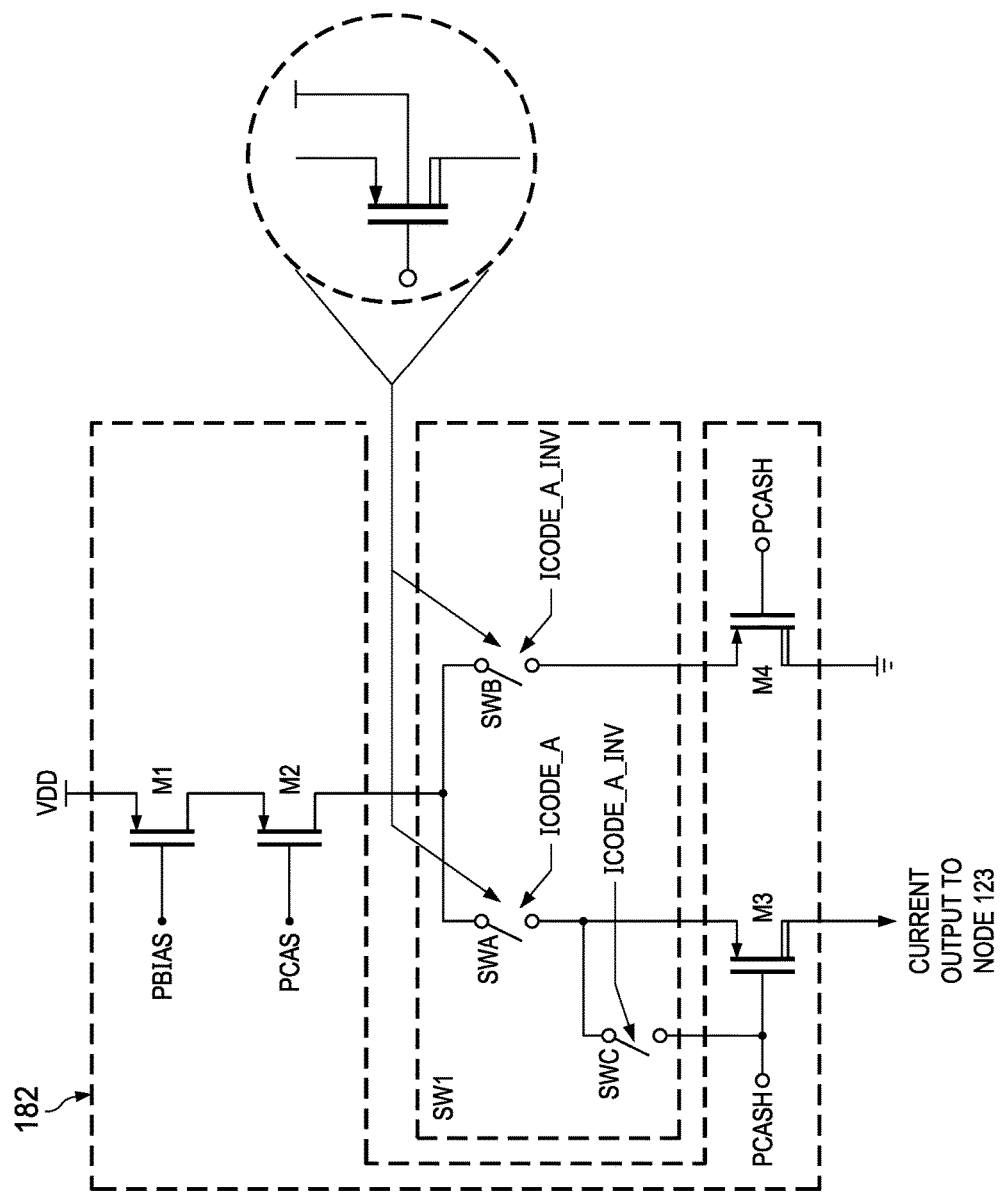
FIG. 2 is a circuit implementation of a current source and switch usable in the current DAC trim circuit of FIG. 1.

FIG. 2 shows an illustrative implementation of a current source device 182 and corresponding switch SW1. In this example, current source device 182 includes transistor M1, M2, M3, and M4, and switch SW1 includes transistor switches SWA, SWB, and SWC. M1-M4 in this example comprise metal oxide semiconductor field effect transistors (MOSFETs) and, more particularly, p-type MOSFETs. Transistor switches SWA-SWC also comprise p-type MOSFETs in this example. Transistors M3 and M4 and transistor switches SWA and SWB may comprise asymmetric drain-extended MOSFETs. An asymmetric drain-extended MOSFET generally can withstand higher voltages across their drain-to-body pn junctions, but have lower threshold voltages and are smaller in size when used as switches than their symmetric drain-extended MOSFET counterparts.

Each transistor and transistor switch shown in FIG. 2 includes a pair of current terminals and a control input. As MOSFETs, the control input is a gate and the current terminals are sources and drains. The source of M1 connects to a supply voltage node (VDD) and the drain of M1 connects to the source of M2. The drain of M2 connects to switches SWA and SWB. The gates of M1 and M2 are biased by voltages labeled as PBIAS and PCAS, respectively. M2 functions as a cascode transistor to increase the output impedance of the current source device. SWA and SWB connect to the source of M3 and source of M4, respectively. The drain of M3 is coupled to the node 123 of the corresponding second stage circuit arm 121. The drain of M4 connects to a ground node. The gates of M3 and M4 also are biased by way of a voltage designated as PCASH. The bias voltages and PBIAS, PCAS, and PCASH are such that, for the sizes of M1-M4 (the ratio of their channel widths W to channel lengths L), the current through M1-M3 to the node 123 will have a magnitude that as described above.

Transistor switch SWA is controlled by a control signal designated as ICODE_A. ICODE_A is one bit of ICODE generated by the ICODE generator 181. Transistor switches SWB and SWC are controlled by ICODE_A_INV which has an opposite polarity compared to ICODE_A. Thus, when SWA is on (closed), SWB and SWC are off (open) and when SWA is off, SWB and SWC are on. As such, when SWA is on, current flows through M1 and M2, through SWA and through M3 to node 123. When SWB is on, current instead flows through M1 and M2, through SWB and through M4 to ground.

In some implementations, even with SWA being off, leakage current may still flow through M3 to node 123. If this is a concern, then switch SWC is included to short the source of M3 to its drain when SWB is on and SWA is off to thereby force M3 to being completely off and incapable of passing much if any leakage current from SWA to node 123.

Figure 3:
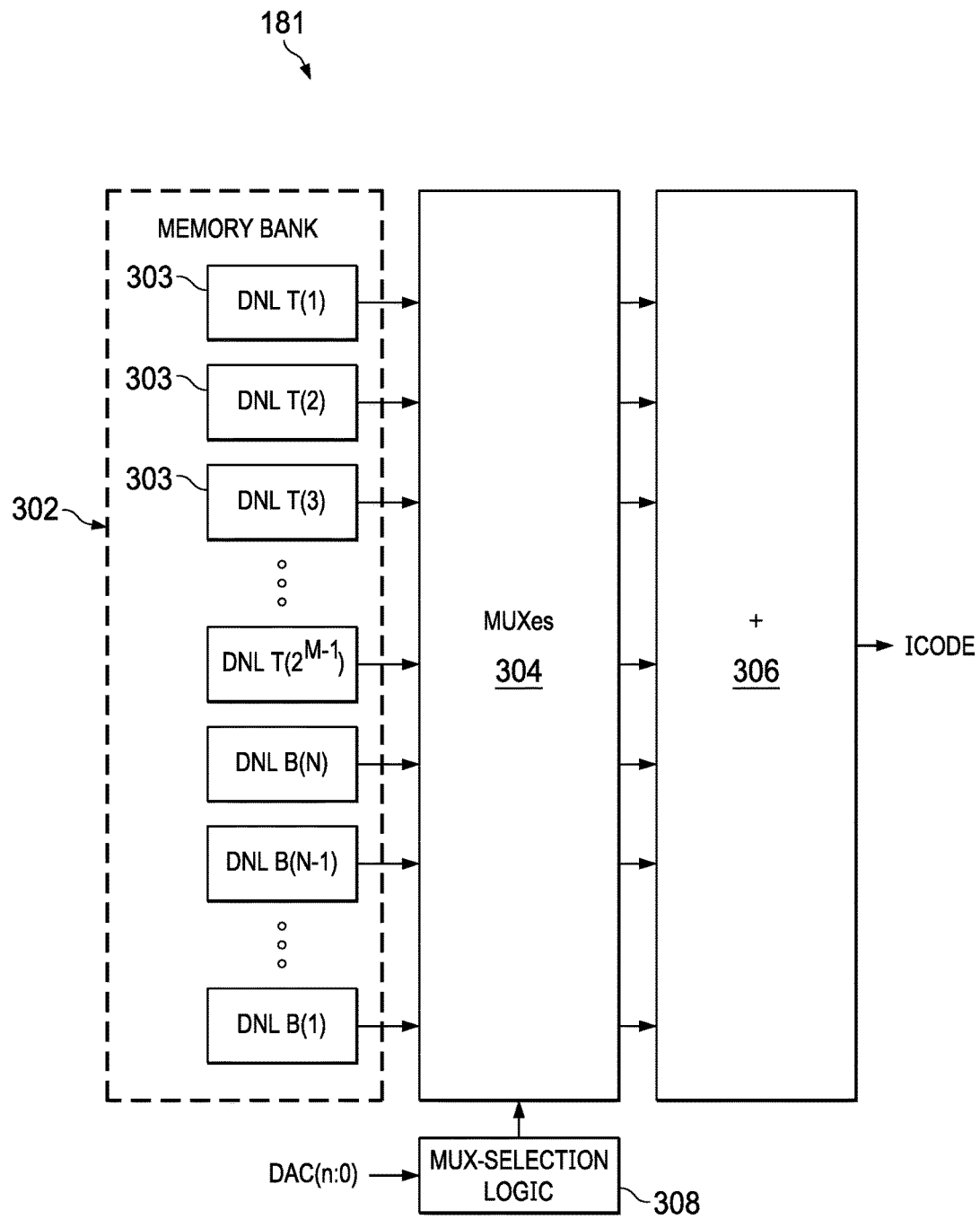
FIG. 3 shows an example implementation of a circuit to generate a code for use by the current DAC trim circuit.

FIG. 3 shows an example of an implementation for the ICODE generator 181. The ICODE generator 181 in this example includes memory 302 in which DNL trim codes 303 are stored (one DNL code for each arm in the ladder of the first and second stages 110, 120). The ICODE generator 181 also includes multiplexers 304 which receive the DNL trim codes 303 and, based on a selection signal from a mux-selection logic 308, provides one or more of the DNL trim codes 303 to a summer 306. The summer then sums the selected DNL trim codes from the multiplexers 304 to produce the ICODE. The ICODE then may be voltage-level shifted to control the on/off state of the switches SW1 (FIG. 1). The DNL trim codes 303 are predetermined based on trim testing performed on the DAC 100 and stored in the memory 302. The use of the DNL trim codes 303 is based on the particular DAC(n:0) to be converted to an analog representation. A mapping between DAC(n:0) and the particular DNL trim codes 303 is implemented in the mux-selection logic 308.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A digital-to-analog converter (DAC), comprising:
   a first stage comprising a plurality of first circuit arms coupled together, each first circuit arm including a resistor;
   a second stage comprising a plurality of second circuit arms coupled together, each second circuit arm comprising a first resistor and a pair of series-connected resistors, the first resistors of the second circuit arms connected in series; and
   a current digital-to-analog converter (IDAC) trim circuit connected to a plurality, but not all, of the second circuit arms of the second stage, the IDAC trim circuit comprising a plurality of first current sources, each first current source coupled to a respective node between a pair of the series-connected resistors of a corresponding second circuit arm, and each of the first current sources is configured to produce a same current level as the other first current sources.

2. The DAC of claim 1, further comprising a plurality of switches, each switch connected between one of the first current sources and the respective node, and when closed, the switch causes current to flow from the current source into the respective node and when open, the switch prevents current from flowing from the current source to the respective node.

3. The DAC of claim 2, further including a code generator to generate a separate control signal for each of the switches, the control signals generated based on a digital input code to be converted to an analog signal by the DAC.

4. The DAC of claim 2, further comprising a plurality of second current sources, the second current sources coupled the same nodes to which the first current sources are coupled, the first current sources to inject current into the respective node and the second current sources to sink current from the respective node.

5. The DAC of claim 4, wherein each of the second current sources is configured to produce a same current level as the other second current sources, and the current level produced by the first current sources is twice that of the second current sources.

6. The DAC of claim 1, wherein each of the second current sources is configured to produce a same current level as the other second current sources, and the current level produced by the first current sources is twice that of the second current sources.

7. The DAC of claim 1, wherein each of the first current sources comprises a first transistor coupled to a supply voltage node and a second transistor coupled to the respective node, and the DAC further includes a switch transistor coupled between the first and second transistors.

8. The DAC of claim 7, wherein the second transistor comprises a drain-extended transistor.

9. The DAC of claim 1, wherein each of the first current sources comprises:
   a first transistor connected to a supply voltage node, the first transistor having a control input coupled to receive a first bias voltage node;
   a second transistor connected to a current terminal of the first transistor and having a control input coupled to receive a second bias voltage node;
   a third transistor connected to the respective node and having a control input coupled to receive a third bias voltage node;
   a fourth transistor connected to a ground node and having a control input coupled to receive the third bias voltage node;
   a first switch connected between a current terminal of the second transistor and a current terminal of the third transistor, the first switch including a control input; and
   a second switch connected between the current terminal of the second transistor and a current terminal of the fourth transistor, the second switch including a control input;
   wherein the control inputs of the first and second switches are to receive complementary control signals such that when one of the first and second switches is on, the other of the first and second switches is off.

10. The DAC of claim 9, wherein each of the first and second switches comprise drain-extended metal oxide semiconductor field effect transistors.

11. The DAC of claim 9, further comprising a third switch connected between a current terminal of the third transistor and the control input of the third transistor, the third switch having a control input coupled to receive the same control signal as the second transistor.

12. The DAC of claim 1, wherein each of the first current sources comprises:

a first transistor connected to a supply voltage node, the first transistor having a control input coupled to receive a first bias voltage node;
a second transistor connected to the respective node and having a control input coupled to receive a second bias voltage node;
a third transistor connected to a ground node and having a control input coupled to receive the second bias voltage node;
a first switch connected between a current terminal of the first transistor and a current terminal of the second transistor, the first switch including a control input; and
a second switch connected between the current terminal of the first transistor and a current terminal of the third transistor, the second switch including a control input;
wherein the control inputs of the first and second switches are to receive complementary control signals such that when one of the first and second switches is on, the other of the first and second switches is off.

13. A circuit, comprising:
a first transistor having first and second current terminals, the first current terminal connected to a supply voltage node, the first transistor having a control input coupled to receive a first bias voltage node;
a second transistor having third and fourth current terminals, the third current terminal connected to the second current terminal and having a control input coupled to receive a second bias voltage node;
a third transistor having fifth and sixth current terminals and having a control input coupled to receive a third bias voltage node;
a fourth transistor having seventh and eighth current terminals, the eighth current terminal connected to a ground node, the fourth transistor having a control input coupled to receive the third bias voltage node;
a first switch connected between the fourth current terminal of the second transistor and the fifth current terminal of the third transistor, the first switch including a control input; and
a second switch connected between the fourth current terminal of the second transistor and the seventh current terminal of the fourth transistor, the second switch including a control input;
wherein the control inputs of the first and second switches are coupled to receive complementary control signals such that when one of the first and second switches is on, the other of the first and second switches is off.

14. The circuit of claim 13, wherein each of the first and second switches comprise drain-extended metal oxide semiconductor field effect transistors.

15. The circuit of claim 13, further comprising a third switch connected between the fifth current terminal of the third transistor and the control input of the third transistor.

16. The circuit of claim 15, wherein the control inputs of the second and third switches are coupled to receive the same control signal.

17. A digital-to-analog converter (DAC), comprising:
a first stage comprising a plurality of first circuit arms coupled together, each first circuit arm including a resistor, each of the plurality of first circuit arms connected to a pair of switches that are selectively operable to couple a first reference voltage or a second reference voltage to the respective first circuit arm based on a bit of a digital code to be converted to an analog signal;
a second stage comprising a plurality of second circuit arms coupled together, each second circuit arm comprising a first resistor and a pair of series-connected resistors, the first resistors of the second circuit arms connected in series, each of the plurality of second circuit arms connected to a pair of switches that are selectively operable to couple the first reference voltage or the second reference voltage to the respective first circuit arm based on a bit of a digital code to be converted to an analog signal; and
a current digital-to-analog converter (IDAC) trim circuit connected to a plurality, but not all, of the second circuit arms of the second stage, the IDAC trim circuit comprising a plurality of first current sources, each first current source coupled to a respective node between a pair of the series-connected resistors of a corresponding second circuit arm, and each of the first current sources is configured to produce a same current level as the other first current sources.

18. The DAC of claim 17, further comprising a plurality of second switches, each second switch connected between one of the first current sources and the respective node, and when a given second switch is closed, the second switch causes current to flow from the current source into the respective node and when the given second switch is open, the second switch prevents current from flowing from the current source to the respective node.

19. The DAC of claim 18, further comprising a plurality of second current sources, the second current sources connected to the same nodes to which the first current sources are coupled, the first current sources to inject current into the respective node and the second current sources to sink current from the respective node.

20. The DAC of claim 19, wherein each of the second current sources is configured to produce a same current level as the other second current sources, and the current level produced by the first current sources is twice that of the second current sources.

* * * * *